(12) United States Patent
Chen

(10) Patent No.: US 11,832,420 B2
(45) Date of Patent: Nov. 28, 2023

(54) DISSIPATING DEVICE

(71) Applicant: Therlect Co., Ltd, Taoyuan (TW)

(72) Inventor: Chien Yu Chen, Taoyuan (TW)

(73) Assignee: THERLECT CO., LTD, Taoyuan (TW)

( * ) Notice: Subject to any disclaimer, the term of this patent is extended or adjusted under 35 U.S.C. 154(b) by 701 days.

(21) Appl. No.: 17/017,004

(22) Filed: Sep. 10, 2020

(65) Prior Publication Data
US 2021/0289663 A1  Sep. 16, 2021

(30) Foreign Application Priority Data

Mar. 11, 2020 (TW) ................................. 109202778

(51) Int. Cl.
*H05K 7/20* (2006.01)
*F28D 15/02* (2006.01)
*F28F 23/00* (2006.01)

(52) U.S. Cl.
CPC ..... *H05K 7/20336* (2013.01); *F28D 15/0283* (2013.01); *F28F 23/00* (2013.01); *F28F 2275/025* (2013.01); *F28F 2275/065* (2013.01)

(58) Field of Classification Search
CPC ........................................................ H05K 7/00
See application file for complete search history.

(56) References Cited

U.S. PATENT DOCUMENTS

2018/0263138 A1\* 9/2018 Wu ........................ F28F 13/003
2019/0033006 A1\* 1/2019 Vanderwees ........ F28D 15/0283

\* cited by examiner

*Primary Examiner* — Jerry Wu
(74) *Attorney, Agent, or Firm* — MUNCY, GEISSLER, OLDS & LOWE, P.C.

(57) ABSTRACT

A dissipating device configured to dissipate the heat energy generated by the heat sources in the electronic devices. When the dissipating device contacts the heat sources, the heat energy can be absorbed by the dissipating device. The working fluid is stored within the dissipating device such that the working fluid can undergo a phase transition after the dissipating device absorbs heat energy. Then the working fluid can circulate inside the dissipating device. Accordingly, the heat-dissipation mechanism, which is applied to the dissipating device contacting the electronic devices, can be effectively sped up. The dissipating device is formed into a thin structure to achieve an excellent heat-dissipation effect with a limited heat-dissipation area.

10 Claims, 9 Drawing Sheets

DISSIPATING DEVICE

BACKGROUND OF INVENTION

(1) Field of the Present Disclosure

The present disclosure relates to a dissipating device, especially a dissipating device configured to dissipate heat energy effectively by means of a working fluid which undergoes a phase transition by absorbing heat energy.

(2) Brief Description of Related Art

With continuous improvement of the efficiency of electronic products, the structure of these products, such as AI computing devices, 5G computing devices, etc., is also tended to be designed to be shorter, smaller, lighter and thinner. These kinds of development make the heat flow density increase inside the electronic components of electronic products, such that the electronic products have a problem with the heat dissipation. Nowadays, there are two common ways to dissipate heat energy, including thermal convection and thermal conduction. The way of thermal convection dissipates heat energy by a cooling fan which can drive an air flow. However, if electronic products were strictly required to be formed in a small size and a thin structure, it is hard to consider the big thick cooling fan by thermal convection. Thus, these electronic products usually use thermal conduction to achieve heat dissipation. At present, those who use thermal conduction technology need heat sinks. The material of different heat sinks directly affects the overall heat dissipation efficiency, and the material mostly used for the heat sink is graphene, while graphene is still expensive. If the electronic products use graphene as the material of heat sink, it will cause a significant increase on the cost of the products. To solve the above shortcomings, there is another way to dissipate heat energy by storing a working fluid that can undergo a phase transition. However, this heat sink needs to be manufactured under negative pressure during the manufacturing process, which makes the overall manufacturing process more difficult. Accordingly, it is urgent and important to improve the heat sink in order to overcome the harsh heat dissipation environment and solve the above disadvantages by different manufacturing methods.

SUMMARY OF INVENTION

It is a primary object of the present disclosure to provide a dissipating device that can work under normal pressure and meet the requirements of the thin structure.

To achieve the aforementioned purpose, the present disclosure dissipating device is configured to dissipate heat energy of an electronic device. There is a working fluid stored inside the dissipating device that can dissipate heat energy. When the dissipating device contacts a heat source of the electronic device, the working fluid is heated and undergoes a phase transition from liquid to vapor and circulates inside the heat-dissipating device. In the process of working fluid circulating in the heat-dissipating device, the heat-dissipating device will form a first temperature region and a second temperature region. After the working fluid absorbs the heat energy of the heat source in the first temperature region, the working fluid is transformed to the vapor state, and then is condensed back to the liquid state in the second temperature region because of relatively cooler region. As the relatively cooler liquid circulates back to the first temperature region to absorb the heat energy and repeat the above reaction, the working fluid can achieve the purpose of dissipating heat energy from the electronic device. In addition to the better heat-dissipation efficiency of the present disclosure, the present disclosure meets the strict structural requirements of the electronic devices and features small size, light and thin structure. Moreover, the dissipating device can be manufactured under normal pressure, such that the semi-finished product can be moved independently before sealing, meaning that the manufacturing process of the present disclosure is extremely safe and convenient.

DETAILED DESCRIPTION OF PREFERRED EMBODIMENTS

Figure 1:
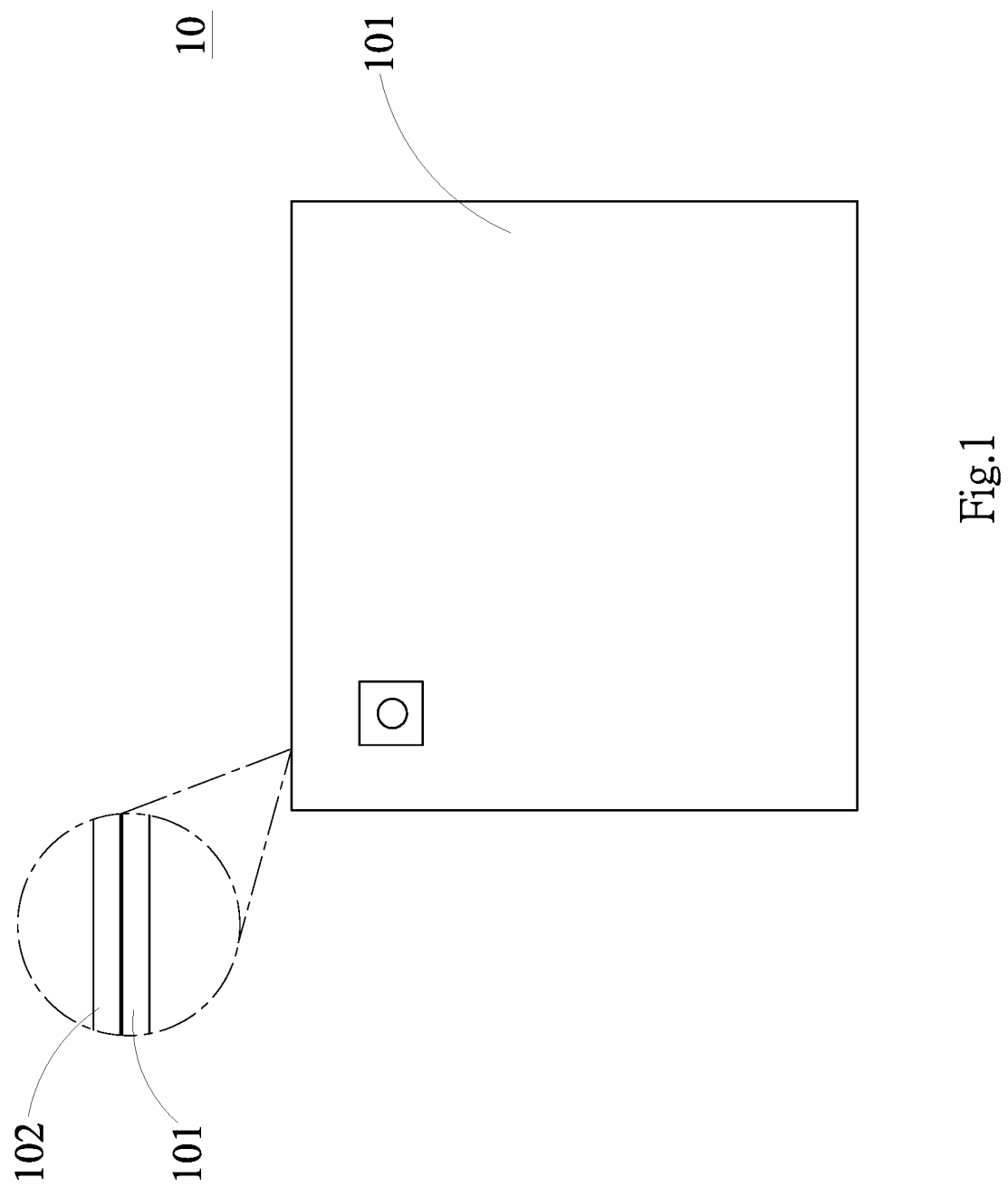
FIG. 1 is a schematic view of the dissipating device of the present disclosure.

Referring to FIG. 1, a dissipating device 10 according to the present disclosure includes a first sheet body 101 and a second sheet body 102. The first sheet body 101 and the second sheet body 102 are assembled into the thin-structured dissipating device 10. Accordingly, the dissipating device 10 can be installed in a thin electronic device for dissipating heat energy. In addition, the first sheet body 101 and the second sheet body 102 are made of material with good thermal conductivity including, but not limited to metallic material (gold, silver, copper, iron, aluminum alloy, etc.) and non-metallic materials (ceramics, glass, graphene, etc.). While not limited thereto, the dissipating device 10 is formed in the rectangular, circular, polygonal or irregular shape. The thickness and the shape of the dissipating device 10 can be designed according to the specific requirements of product.

Figure 2:
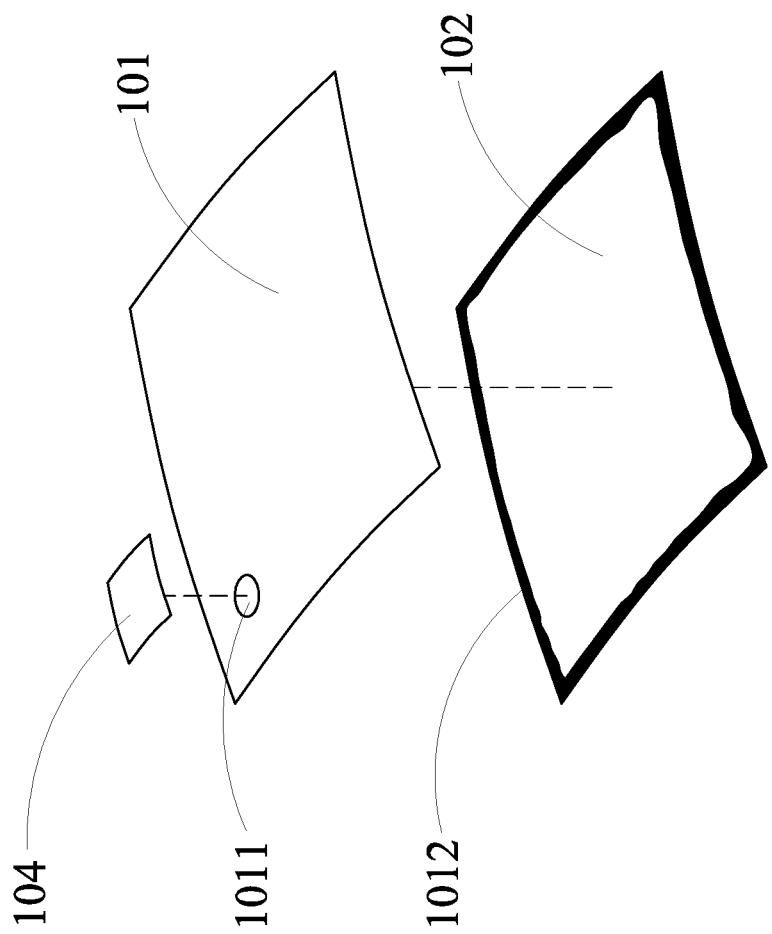
FIG. 2 is a schematic view I of the composition of the present disclosure.
Figure 3:
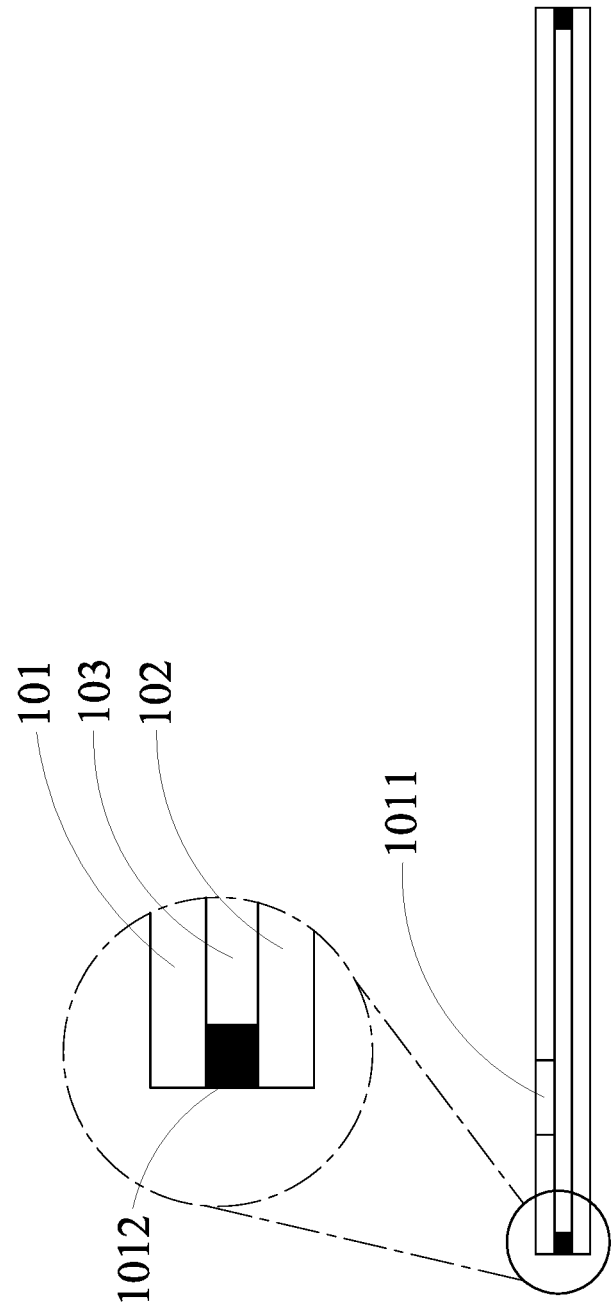
FIG. 3 is a schematic view II of the composition of the present disclosure.

Referring to FIG. 2, a through hole 1011 is formed on the first sheet body 101. The first sheet body 101 and the second sheet body 102 are assembled by coating an adhesive member 1012 on the edges of the first sheet body 101 and the second sheet body 102 such that the first sheet body 101 can be adhered to the second sheet body 102. After the adhesive member 1012 is cured, the edges of the first sheet body 101 and the second sheet body 102 can be adhered to each other and sealed by the adhesive member 1012. The adhesive materials of the adhesive member 1012 include, but not limited to silicone resin, epoxy resin, polyurethane and polymethyl methacrylate (PMMA). Referring to FIG. 3, after the adhesive member 1012 is cured and the first sheet body 101 and the second sheet body 102 are completely adhered, a working space 103 is formed between the first sheet body 101 and the second sheet body 102 by the support from the adhesive member 1012. The width of the working space 103 is affected by the coating thickness of the adhesive member 1012, that is, the width of the working space 103 can be adjusted by the adhesive member 1012. The thickness after sticking the first sheet body 101 and the second sheet body 102 together is between 0.2 and 0.5 mm. Back to FIG. 2 again, the dissipating device 10 further includes a sealing member 104. The sealing member 104 is disposed upon the through hole 1011, such that the sealing member 104 can cover the through hole 1011. The sealing member 104 is ultrasonically welded to close the through hole 1011, so that it can maintain the internal pressure state of the working space 103.

Figure 4:
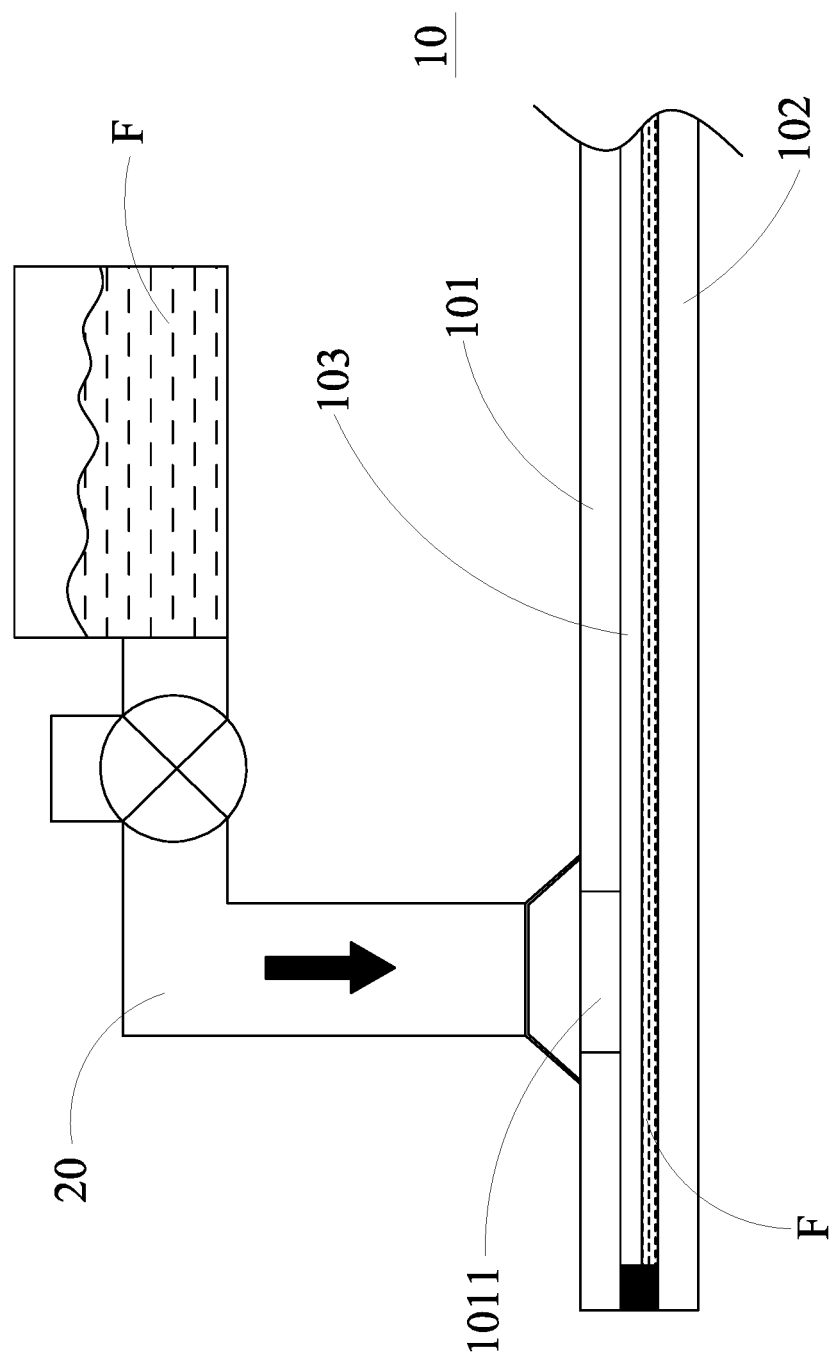
FIG. 4 is a schematic view I of the implementation of the present disclosure.

Referring to FIG. 4, a liquid injection device 20 can inject a working fluid F into the working space 103 through the through hole 1011 after the first sheet body 101 and the second sheet body 102 are adhered together. The volume ratio of the working fluid F to the working space 103 ranges from 0.5 to 0.95, while the preferred volume ratio is 0.5. The working fluid F can be composed of more than one liquid, such that the working fluid F can undergo the phase transition between vapor state and liquid state when the working fluid F is heated or cooled. According to the preferred embodiment, the working fluid F is a mixture of water, alcohols and fluorine liquids. After heated, the working fluid F transits from liquid to vapor. In addition, the liquid injection process of the dissipating device 10 can be performed under normal pressure or vacuum environment.

Figure 5:
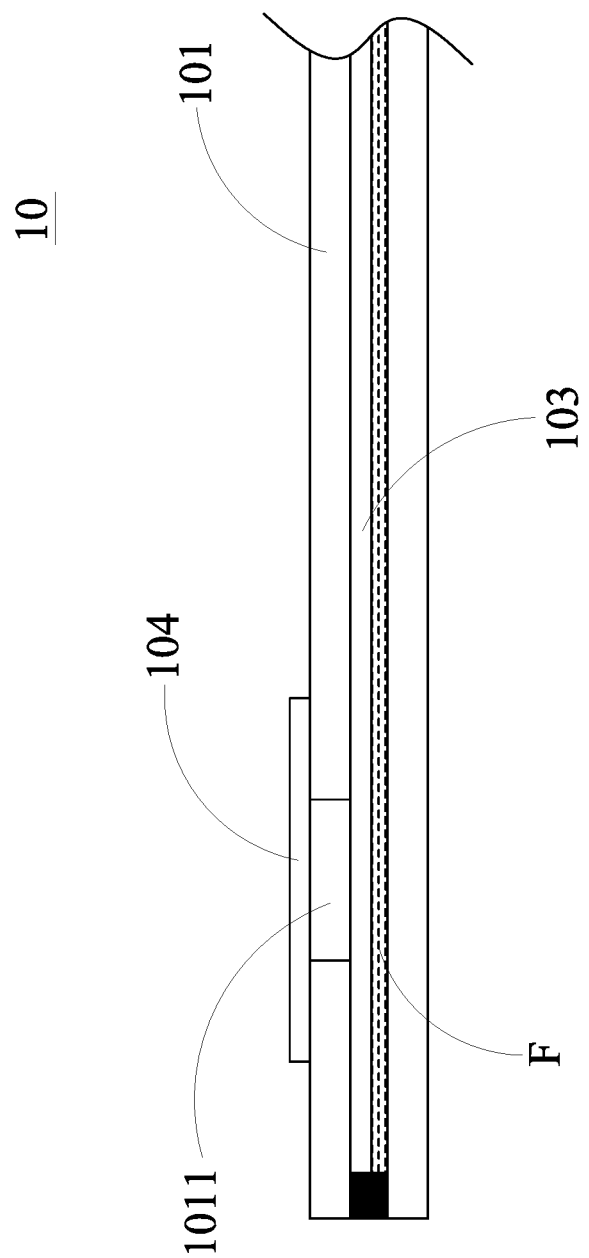
FIG. 5 is a schematic view II of the implementation of the present disclosure.

Referring to FIG. 5, the sealing member 104 is placed upon the first sheet body 101 to cover the through hole 1011 after the dissipating device 10 completes the liquid injection. The material of the sealing member 104 can be polystyrene, styrene acrylonitrile resin, acrylonitrile butadiene styrene, polycarbonate, nylon, polysulfate, polyurethane (PU), etc. The area of the sealing member 104 is larger than that of the through hole 1011 to cover the through hole 1011 and its surrounding area, so that the working space 103 is closed to prevent the working fluid F from flowing out of the through hole 1011.

Figure 6:
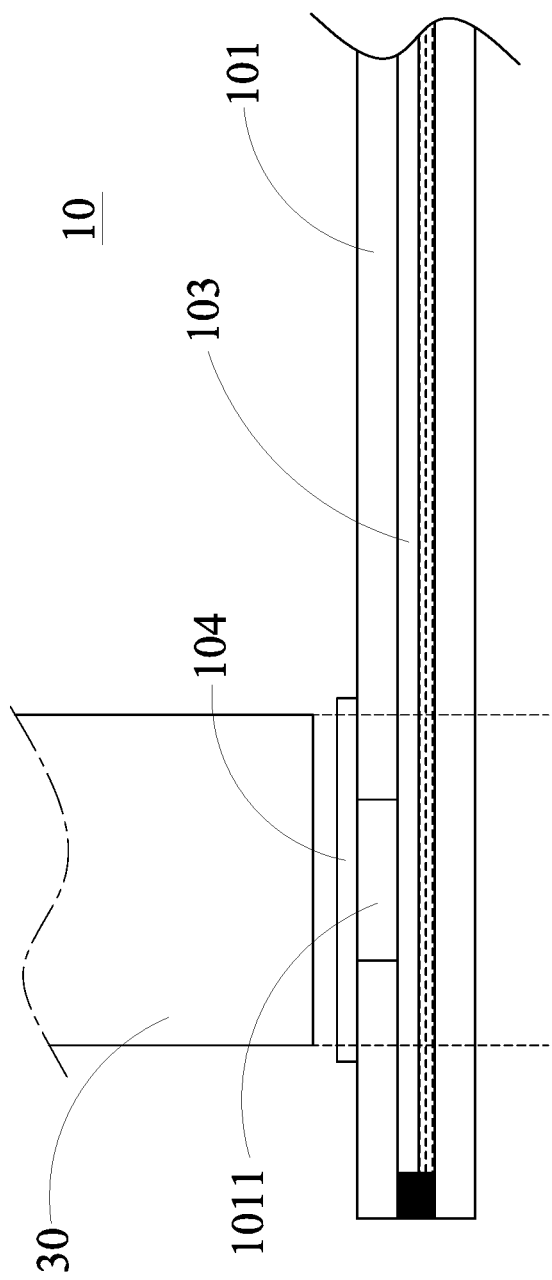
FIG. 6 is a schematic view III of the implementation of the present disclosure.
Figure 7:
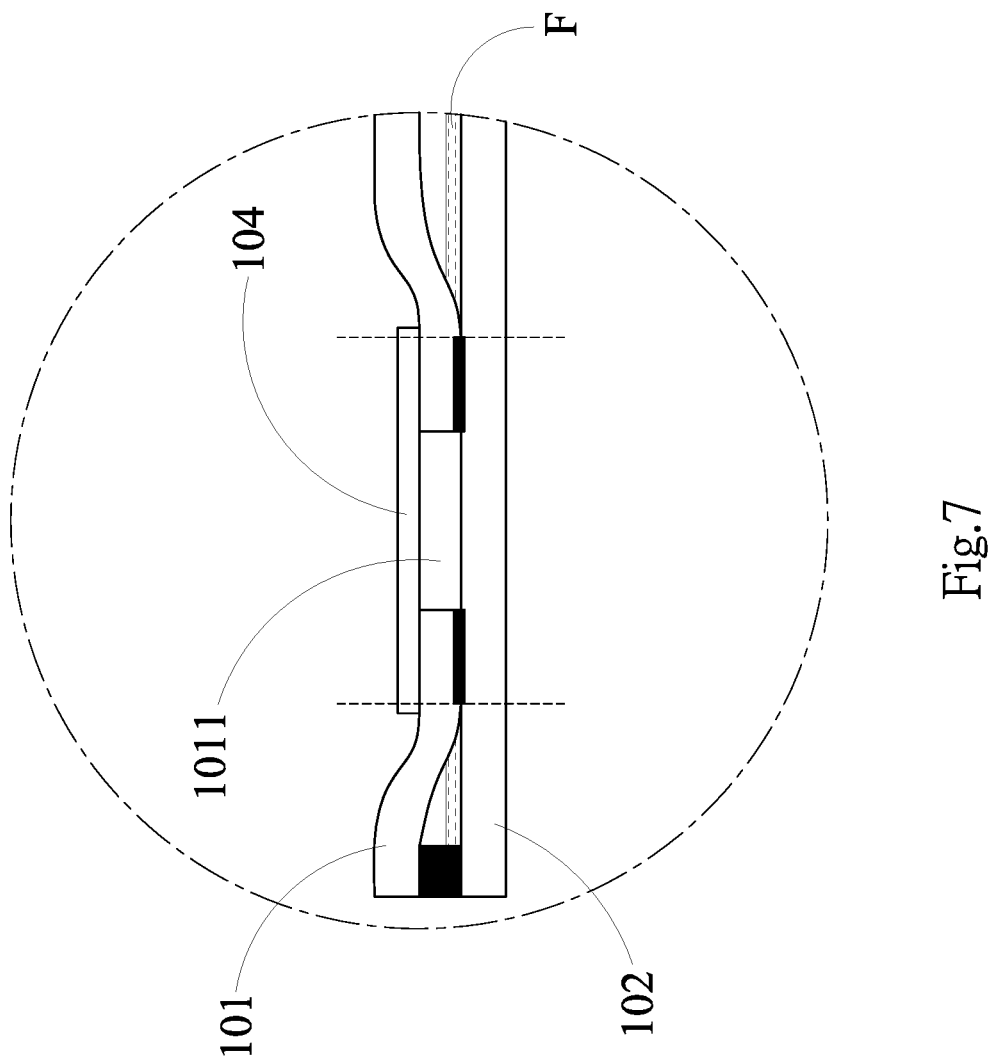
FIG. 7 is a schematic view IV of the implementation of the present disclosure.

Referring to FIG. 6 and FIG. 7, the surrounding area of the through hole 1011 is ultrasonically welded by a sealing apparatus 30 after the sealing member 104 covers the through hole 1011. The surrounding area of the through hole 1011 on the first sheet body 101 will be slightly deformed during the process of the ultrasonic welding around the through hole 1011 such that the surrounding area is attached and welded to the sheet body 102 and the through hole 1011 is sealed after the region around the through hole is welded. Furthermore, the working fluid F is prevented from flowing out of the through hole 1011 to maintain the internal pressure of the working space 103. In addition, the liquid injection and the sealing process of the present disclosure can be performed under normal or negative pressure according to different product parameter requirements.

Figure 8:
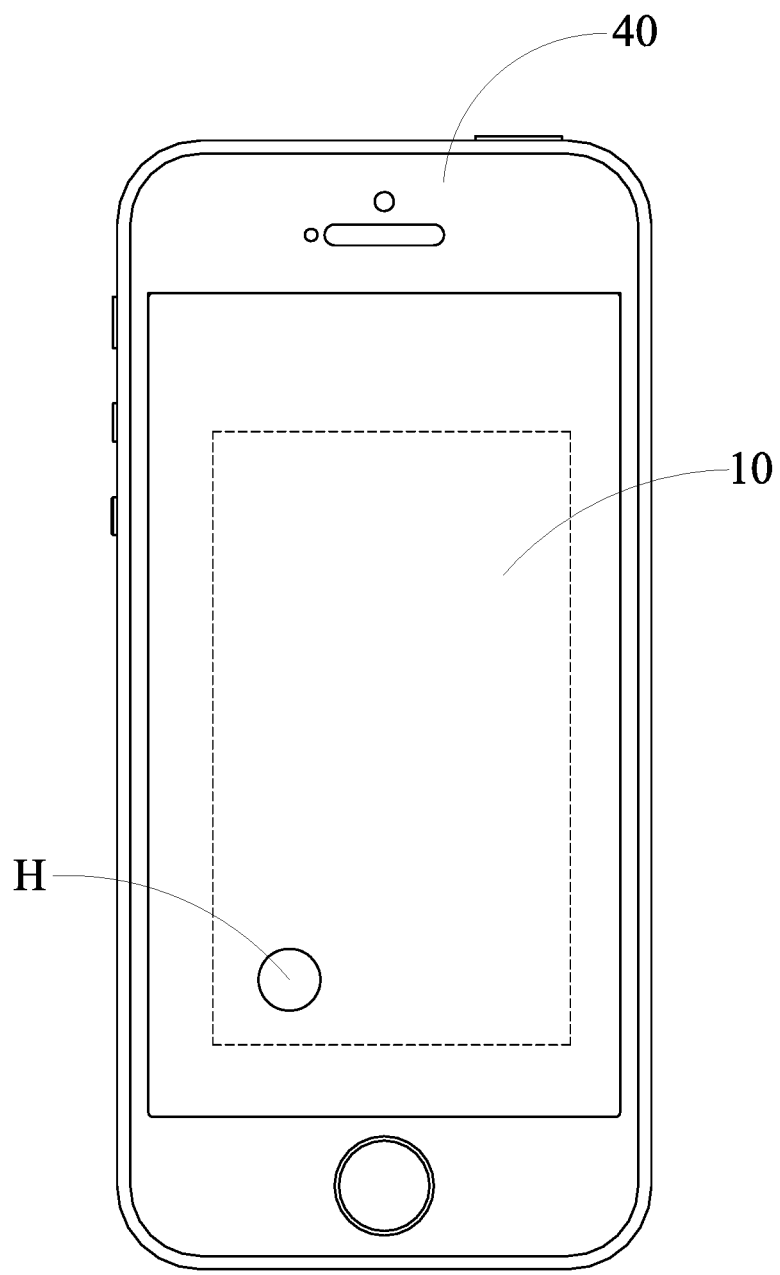
FIG. 8 is a schematic view V of the implementation of the present disclosure.

Referring to FIG. 8, the dissipating device 10 is installed in an electronic device 40 and contacts a heat source H of the electronic device 40. The location and size of the dissipating device 10 can be designed and installed according to the actual structure of the electronic device 40. According to the embodiment of the present disclosure, the size or installation location of the dissipating device 10 is not limited.

Figure 9:
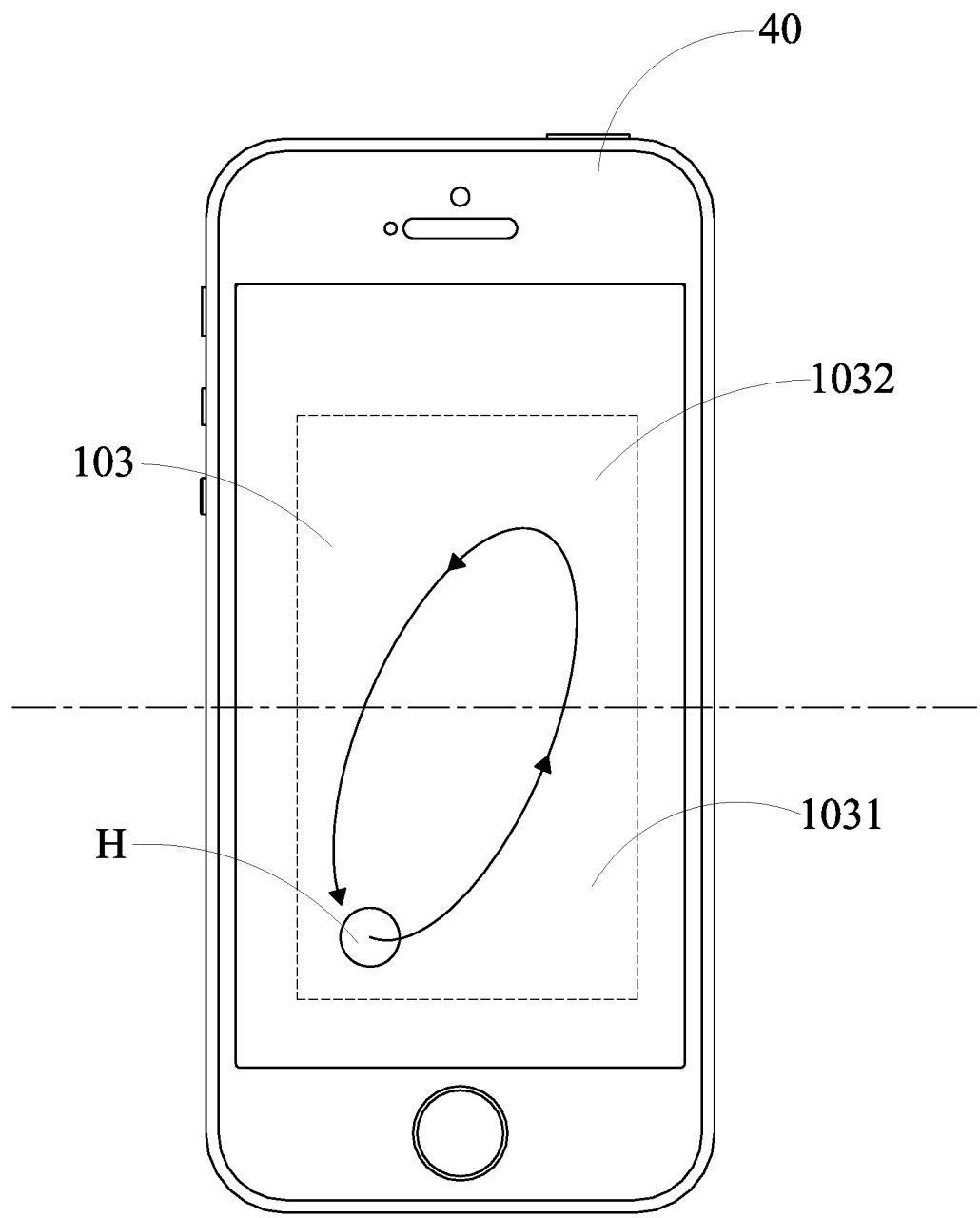
FIG. 9 is a schematic view VI of the implementation of the present disclosure.

Referring to FIG. 9, the dissipating device 10 conducts heat energy through the first sheet body 101 or the second sheet body 102 when the electronic device 40 generates the heat source H. Then, the working fluid F is heated in the working space 103. The working fluid F undergoes the phase transition and circulates in the working space 103 after being heated, thereby forming the first temperature region 1031 and the second temperature region 1032. The first temperature region 1031 is relatively hotter than the second temperature region 1032. By thermal conduction from the direct contact of the heat source H and the first temperature region 1031, the working fluid F transits from liquid to vapor after absorbing the heat energy from heat source H. The vapor thus moves to the second temperature region 1032. The temperature of the second temperature region 1032 is relatively lower than that of the first temperature region 1031, such that the working fluid F transits again from vapor to liquid in the second temperature region 1032. Furthermore, the working fluid F is condensed into liquid and circulates back to the first temperature region 1031, such that the working fluid F absorbs heat energy again in order to continue the above circulation. In the process of circulating, the working fluid F continuously dissipates heat energy to the outside of the dissipating device 10. According to the mechanism of the present disclosure, the dissipating device 10 can be made as a thin structure in order to fit in different thin electronic devices.

To sum up, the dissipating device of the present disclosure can dissipate heat of an electronic device. The dissipating device is composed of a first sheet body and a second sheet body, wherein a sealed working space is formed between the first sheet body and the second sheet body. Furthermore, a working fluid is stored in the working space. The working fluid undergoes the phase transition between liquid and vapor after being heated or cooled. The working fluid is heated by the heat source when the dissipating device contacts a heat source of the electronic device. Then, based on the phase transition reaction, the working fluid circulates inside the working space and forms a first temperature region and a second temperature region. The first temperature region is the place where the heat source generates heat energy. The working fluid in the vapor state circulates to the relatively cooler second temperature region and condensed back to liquid state in order to flow back to the first temperature region and keep the circulation. Heat energy thus can be dissipated in the first temperature region by heat conduction. Moreover, the process of manufacture the dissipating device can be operated under normal pressure. There is no need of the process to be manufactured under negative pressure or vacuum treatment. Accordingly, the present disclosure can indeed achieve the purpose of offering a thin structure that can operate under normal pressure.

All the above is showed with only preferred embodiments but not to limit the scope of implementation of the present disclosure. Any changes or modifications, which made by those who skilled in this art without departing from the spirit and the scope of the present invention, should be covered in the scope of the patent of the present disclosure.

What is claimed is:

1. A dissipating device for dissipating heat energy of an electronic device, comprising: a first sheet body with a through hole; a second sheet body; an adhesive member coated on opposing edges of the first sheet body and the second sheet body, so that the first sheet body is correspondingly adhered to the second sheet body by the adhesive member to form a width of a working space, the working space being created in which a working fluid is filled when the first sheet body the second sheet body are adhered together; and a sealing member positioned above a surrounding part of the through hole to seal the working space, wherein, after an ultrasonic welding process is performed around the through hole of the first sheet body, the surrounding part of the through hole is attached and welded to the second sheet body for sealing the through hole.

2. The dissipating device as recited in claim 1, wherein a first temperature region and a second temperature region are formed in the working space after the working fluid undergoes a phase transition by absorbing heat energy generated by a heat source.

3. The dissipating device as recited in claim 2, wherein the temperature of the first temperature region is higher than that of the second temperature region.

4. The dissipating device as recited in claim 1, wherein the sealing member is ultrasonically welded to the through hole, such that the sealing member is welded to the through hole.

5. The dissipating device as recited in claim 1, wherein the area of the sealing member is larger than that of the through hole.

6. The dissipating device as recited in claim 1, wherein the volume ratio of the working fluid to the working space ranges from 0.5 to 0.95.

7. The dissipating device as recited in claim 6, wherein the volume ratio of the working fluid to the working space is 0.5.

8. The dissipating device as recited in claim 1, wherein the working fluid is a mixture of more than one liquid.

9. The dissipating device as recited in claim 8, wherein the working fluid is a mixture of water, alcohol and fluorine liquid.

10. The dissipating device as recited in claim 1, wherein the thickness ranges from 0.2 to 0.5 mm after the first sheet body and the second sheet body are adhered together.

\* \* \* \* \*